(12) United States Patent
Slotnick

(10) Patent No.: US 10,666,217 B2
(45) Date of Patent: *May 26, 2020

(54) DYNAMICALLY EXTENDING LOUDSPEAKER CAPABILITIES

(71) Applicant: GOOGLE LLC, Mountain View, CA (US)

(72) Inventor: Gabriel Slotnick, Los Altos, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/264,121

(22) Filed: Jan. 31, 2019

(65) Prior Publication Data

US 2019/0165749 A1    May 30, 2019

Related U.S. Application Data

(63) Continuation of application No. 15/841,398, filed on Dec. 14, 2017, now Pat. No. 10,200,003.

(60) Provisional application No. 62/567,710, filed on Oct. 3, 2017.

(51) Int. Cl.
*H04R 3/04*     (2006.01)
*H03G 5/16*     (2006.01)
*H03G 5/00*     (2006.01)

(52) U.S. Cl.
CPC ............. *H03G 5/165* (2013.01); *H03G 5/005* (2013.01); *H04R 3/04* (2013.01); *H04R 2430/01* (2013.01)

(58) Field of Classification Search
CPC .... H03G 5/005; H03G 5/165; H04R 2430/01; H04R 3/04

USPC ........ 381/63, 94.2, 94.3, 94.8, 98, 100, 102, 381/103, 104, 111, 120, 308
See application file for complete search history.

(56) References Cited

U.S. PATENT DOCUMENTS

| | | | |
|---|---|---|---|
| 5,361,381 A | 11/1994 | Short | |
| 9,432,761 B2* | 8/2016 | Gautama | H03G 3/20 |
| 10,200,003 B1* | 2/2019 | Slotnick | H04R 3/04 |
| 2005/0094829 A1* | 5/2005 | Cordell | H04R 3/08 381/103 |
| 2013/0028436 A1 | 1/2013 | Christoph | |
| 2013/0163784 A1* | 6/2013 | Tracey | H03G 3/00 381/103 |
| 2013/0230191 A1* | 9/2013 | Hoang Co Thuy | H03G 3/007 381/104 |

(Continued)

OTHER PUBLICATIONS

Google LLC, International Search Report/Written Opinion, PCT/US2018/041069, dated Sep. 28, 2018, 12 pgs.

*Primary Examiner* — Paul Kim
*Assistant Examiner* — Friedrich Fahnert
(74) *Attorney, Agent, or Firm* — Morgan, Lewis & Bockius LLP (57) ABSTRACT

A method for dynamic equalization is performed at a system. The system receives an electronic audio signal. The system monitors available headroom based on two or more of: an amplifier of the system, a change in volume of the system, characteristics of a transducer of a loudspeaker associated with the system, and the audio signal. Responsive to a change in the available headroom, the system modifies one or more parameters of an equalizer to at least a portion of the signal in order to extend a physical low-frequency response of the loudspeaker, the one or more parameters comprising a gain for the and a frequency.

20 Claims, 6 Drawing Sheets

(56) References Cited

U.S. PATENT DOCUMENTS

| | | |
|---|---|---|
| 2016/0183000 A1* | 6/2016 | Katsianos ............... H03G 3/00 381/63 |
| 2017/0126194 A1 | 5/2017 | Jot et al. |
| 2017/0195792 A1 | 7/2017 | Einaudi et al. |

* cited by examiner

FIG. 1

$$202 \Big\{ LTgain = \min(-vol - MUgain, 18)$$

$$204 \Big\{ F_b' = \frac{F_b}{2^{\frac{LTgain}{12}}}$$

$$206 \Big\{ LTfreq = \frac{1}{2}(F_b' + F_b)$$

$$208 \Big\{ freq = k \times F_b'$$

$$210 \Big\{ HFgain = a \times LTgain$$

FIG. 2

```
"dynamic_shelving": {
    "speaker_cutoff_hz":       [FLOAT],
    "lf_content_coeff":        [FLOAT],
    "maximum_gain_db":         [FLOAT],
    "gain_scale_factor":       [FLOAT],  // e.g., range is [0.0, 1.0]
    "makeup_gain_db":          [FLOAT],
    "high_shelf_hz":           [FLOAT],  // e.g., fixed frequency for high shelf
    "high_shelf_gain_factor":  [FLOAT]   // e.g., HFgain / LFgain
}
```

FIG. 3

| Array Index | App. Parameter # | Parameter Name | Value |
|---|---|---|---|
| 0 | Pr 6 | LF CONTENT FREQUENCY | freq |
| 1 | Pr 39 | IPEQ2 ACTIVE | 1 |
| 2 | Pr 45 | PEQ2 BAND1 TYPE | 1 |
| 3 | Pr 46 | PEQ2 BAND1 FREQ | LF freq |
| 4 | Pr 47 | PEQ2 BAND1 GAIN | LF gain |
| 5 | Pr 48 | PEQ2 BAND1 Q | 0.707107 |
| 6 | Pr 49 | PEQ2 BAND1 ACTIVE | 1 |
| 7 | Pr 55 | PEQ2 BAND2 TYPE | 2 |
| 8 | Pr 56 | PEQ2 BAND2 FREQ | Define in Cast_audio.json? For now: 4389 |
| 9 | Pr 57 | PEQ2 BAND2 GAIN | HF gain |
| 10 | Pr 58 | PEQ2 BAND2 Q | 0.71 |
| 11 | Pr 59 | PEQ2 BAND2 ACTIVE | 1 |

DYNAMICALLY EXTENDING LOUDSPEAKER CAPABILITIES

RELATED APPLICATIONS

This application is a continuation of U.S. patent application Ser. No. 15/841,398, filed Dec. 14, 2017, titled "Dynamically Extending Loudspeaker Capabilities," which claims priority to U.S. Patent Application Ser. No. 62/567,710, filed Oct. 3, 2017, titled entitled "Dynamically Extending Loudspeaker Capabilities," all of which are incorporated by reference herein in their entirety.

TECHNICAL FIELD

The present disclosure relates generally to audio. More particularly, the present disclosure relates to dynamically extending loudspeaker capabilities.

BACKGROUND

A loudspeaker or speaker is an electroacoustic transducer that converts an electronic audio signal into a corresponding sound. For example, a loudspeaker can include a magnet and a voice coil, which can be attached to a diaphragm. When an electronic signal is applied to the voice coil, a magnetic field can be created by the electric current in the voice coil, making it a variable electromagnet, which can interact with the field of the magnet to generate mechanical force that causes the voice coil and thus the attached diaphragm to move and produce audio frequencies under the control of the applied signal.

SUMMARY

Aspects and advantages of embodiments of the present disclosure will be set forth in part in the following description, or can be learned from the description, or can be learned through practice of the embodiments.

One example aspect of the present disclosure is directed to a method for dynamic equalization. The method can include receiving, by a system comprising a loudspeaker, an electronic audio signal. The method can include, responsive to a change in available headroom, modifying, based on the change in available headroom, one or more parameters of an equalizer being applied to at least a portion of the signal in order to extend a physical low-frequency response of the loudspeaker.

Another example aspect of the present disclosure is directed to a method for dynamically extending low-frequency capability of an audio system. The method can include, receiving, by a system comprising a loudspeaker, an electronic audio signal. The method can include, responsive to a change in available headroom, adjusting, based on the change in available headroom, a bandwidth of low-frequency content of the signal that is being synthesized by the system to extend low-frequency capability of the system beyond physical capabilities of the system.

Another example aspect of the present disclosure is directed to a system for dynamically extending loudspeaker capabilities. The system can include a loudspeaker and circuitry. The circuitry can be configured to cause the system to, responsive to a change in available headroom: modify, based on the change in available headroom, one or more parameters of an equalizer being applied to at least a portion of a signal in order to extend a physical low-frequency response of the loudspeaker; and adjust, based on at least one parameter of the one or more parameters, a bandwidth of low-frequency content of the signal that is being synthesized by the system to extend low-frequency capability of the system beyond physical capabilities of the system.

Other aspects of the present disclosure are directed to various systems, apparatuses, non-transitory computer-readable media, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

DETAILED DESCRIPTION

Generally, the present disclosure is directed to methods and systems for dynamically extending loudspeaker capabilities. In particular, in an audio system comprising a loudspeaker, the amount of available headroom can vary (e.g., based on available amplifier headroom, a change in volume of the system, excursion characteristics of a transducer of the loudspeaker, analysis of an electronic audio signal received by the system, and/or the like). By modifying, based on the change in available headroom, one or more parameters of one or more techniques applied to extend capabilities of the loudspeaker, the technique(s) can be dynamically adjusted to exploit the currently available capacity of the system, further extending the capabilities of the system.

In some embodiments, the technique(s) applied to extend capabilities of the system can include applying an equalizer to at least a portion of a signal received by the system in order to extend the physical low-frequency response of the loudspeaker. In accordance with aspects of the disclosure, responsive to a change in available headroom, one or more parameters of such an equalizer can be modified based on the change in available headroom. Accordingly, the system can dynamically adjust the equalizer based on the current capabilities of the system. In some embodiments, the equalizer can be a second-order low-frequency shelving equalizer.

In some embodiments, the technique(s) applied to extend capabilities of the system can include synthesizing a bandwidth of low-frequency content of a signal received by the system to extend the low-frequency capability of the system beyond physical capabilities of the system. For example, psychoacoustic principles provide that a human brain will synthesize a fundamental frequency as if the fundamental frequency physically existed if the sensory system associated with the brain is exposed to a harmonic structure corresponding to the fundamental frequency. Accordingly, the low-frequency capability of a system can be extended by producing a harmonic structure corresponding to a fundamental frequency that is beyond the physical capabilities of the system. In accordance with aspects of the disclosure, responsive to a change in available headroom, a bandwidth of low-frequency content of a signal that is being synthesized to extend low-frequency capability of the system beyond physical capabilities of the system can be adjusted based on the change in available headroom. Accordingly, the system can dynamically adjust the bandwidth that is being synthesized based on the current capabilities of the system.

The systems and methods described herein can provide a number of technical effects and benefits. For example, the systems and methods described herein can extend the capabilities of a system comprising a loudspeaker based on the currently available capacity of the system.

With reference now to the Figures, example embodiments of the present disclosure will be discussed in further detail.

Figure 1:
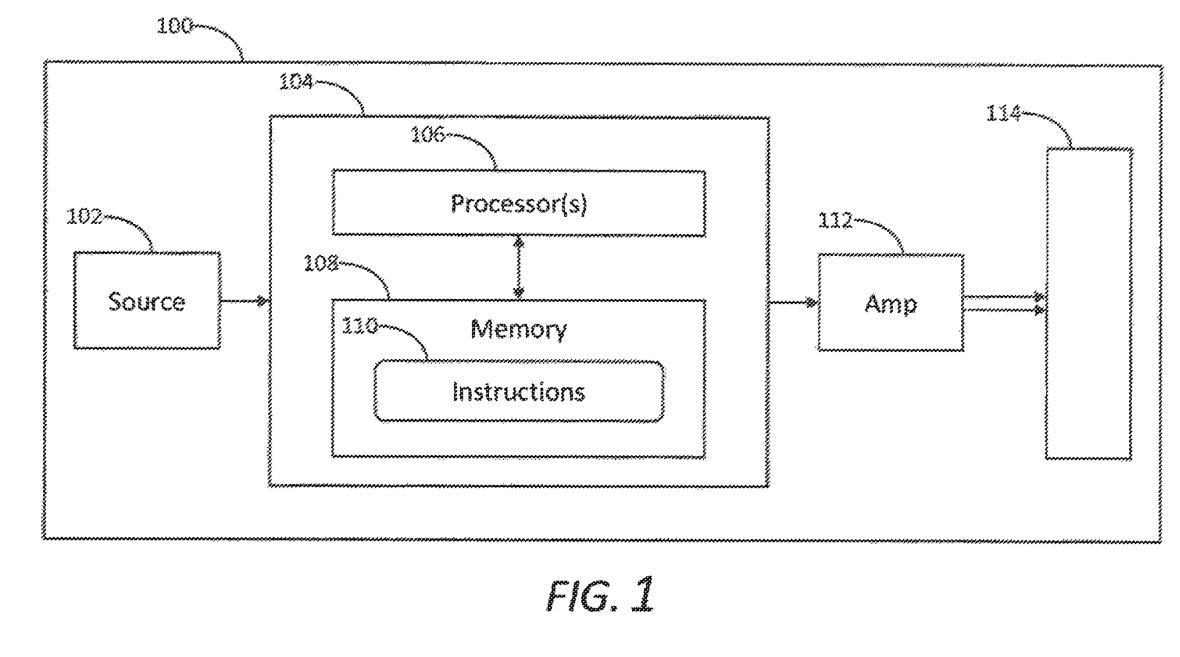
FIG. 1 depicts a block diagram of an example system according to example embodiments of the present disclosure.

FIG. 1 depicts a block diagram of an example system according to example embodiments of the present disclosure. Referring to FIG. 1, system 100 can include source 102, circuitry 104, amp (or amplifier) 112, and loudspeaker 114. Source 102 can produce an electronic audio signal and transmit the signal to circuitry 104. Circuitry 104 can receive the signal from source 102 and can be configured to modify the signal (e.g., via digital signal processing) and then transmit the modified signal to amp 112. Amp 112 can receive the modified signal from circuitry 104, amplify the signal, and transmit the amplified signal to loudspeaker 114, which can produce audio frequencies in accordance with the amplified signal. Circuitry 104 can comprise one or more processors 106 and memory 108. Memory 108 can store instructions 110, which when executed by processor(s) 106 can cause circuitry 104 (and thus system 100) to perform one or more functions described herein. It will be appreciated that in some embodiments, circuitry 104 can comprise source 102.

Circuitry 104 can be configured to modify the signal received from source 102 in accordance with one or more techniques for extending the capabilities of loudspeaker 114 (and thus system 100). For example, circuitry 104 can be configured to apply an equalizer to at least a portion of the signal received from source 102 in order to extend a physical low-frequency response of loudspeaker 114. In some embodiments, the equalizer can be a second-order low-frequency shelving equalizer. In accordance with aspects of the disclosure, circuitry 104 can be configured to, responsive to a change in available headroom (e.g., based on available headroom of amp 112, a change in volume of system 100, excursion characteristics of a transducer of loudspeaker 114, analysis of the signal received from source 102, and/or the like), modify one or more parameters of the equalizer based on the change in available headroom. Accordingly, system 100 can dynamically adjust the equalizer based on the current capabilities of system 100.

In some embodiments, the equalizer can be configured to apply a Linkwitz transform to the portion of the signal. In such embodiments, the parameter(s) modified can include a gain for the Linkwitz transform and/or a frequency for the Linkwitz transform.

Figure 2:
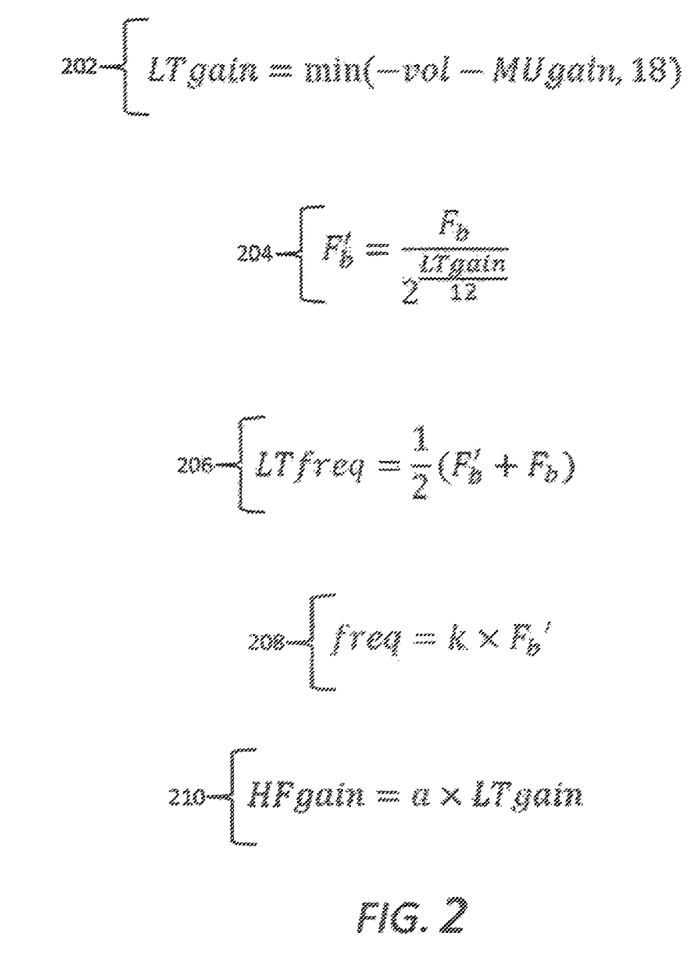
FIG. 2 depicts example formulas for determining parameters according to example embodiments of the present disclosure.

FIG. 2 depicts example formulas for determining parameters according to example embodiments of the present disclosure. Referring to FIG. 2, formula 202 illustrates an example approach for determining the gain for the Linkwitz transform. As illustrated, the gain for the Linkwitz transform can be determined by determining the negative of the volume of system 100 (e.g., in decibels) less the make-up gain of system 100 (e.g., the make-up gain of the backend audio limiter gain stage in decibels), and then taking the minimum of the result and a fixed limit (e.g., 18 decibels).

Formula 204 illustrates an example approach for determining a low-frequency cutoff. As illustrated, the low-frequency cutoff can be determined by dividing the box-tuning frequency of system 100 before the Linkwitz transform is applied to the at least a portion of the signal (e.g., determined based on empirical evidence) by the result of two to the power of the result of dividing the gain for the Linkwitz transform by twelve (e.g., for each decibel of volume attenuation, the frequency can be reduced by one-twelfth of an octave).

Formula 206 illustrates an example approach for determining the frequency for the Linkwitz transform. As illustrated, the frequency for the Linkwitz transform can be determined by taking the average of the low-frequency cutoff and the box-tuning frequency of system 100 before the Linkwitz transform is applied to the at least a portion of the signal.

In some embodiments, circuitry 104 can be configured to synthesize a bandwidth of low-frequency content of the signal received from source 102 to extend the low-frequency capability of system 100 beyond the physical capabilities of system 100. For example, circuitry 104 can be configured to cause system 100 to produce (e.g., via loudspeaker 114) a harmonic structure corresponding to a portion of the content of the signal comprising a fundamental frequency that is beyond the physical capabilities of system 100 such that a human brain synthesizes the fundamental frequency as if the fundamental frequency physically existed. In accordance with aspects of the disclosure, circuitry 104 can be configured to, responsive to a change in available headroom (e.g., based on available headroom of amp 112, a change in volume of system 100, excursion characteristics of a transducer of loudspeaker 114, analysis of the signal received from source 102, and/or the like), adjust the bandwidth of the content being synthesized based on the change in available headroom. Accordingly, system 100 can dynamically adjust the bandwidth that is being synthesized based on the current capabilities of system 100.

Referring to FIG. 2, formula 208 illustrates an example approach for determining the frequency for the bandwidth of the low-frequency content. As illustrated, the frequency may be determined by multiplying the low-frequency cutoff by a constant (e.g., a device specific value (e.g., 0.94) determined to retain a relationship between the two frequencies).

In some embodiments, circuitry 104 can be configured to apply a high-frequency gain equalizer to at least a portion of the signal received from source 102 (e.g., in order to compensate for implementing the technique(s) described above). Referring to FIG. 2, formula 210 illustrates an example approach for determining the high-frequency gain for such an equalizer. As illustrated, the high-frequency gain can be determined by multiplying the gain for the Linkwitz transform by a constant (e.g., a device specific value (e.g., 0.39) determined to control loudness compensation).

Figure 3:
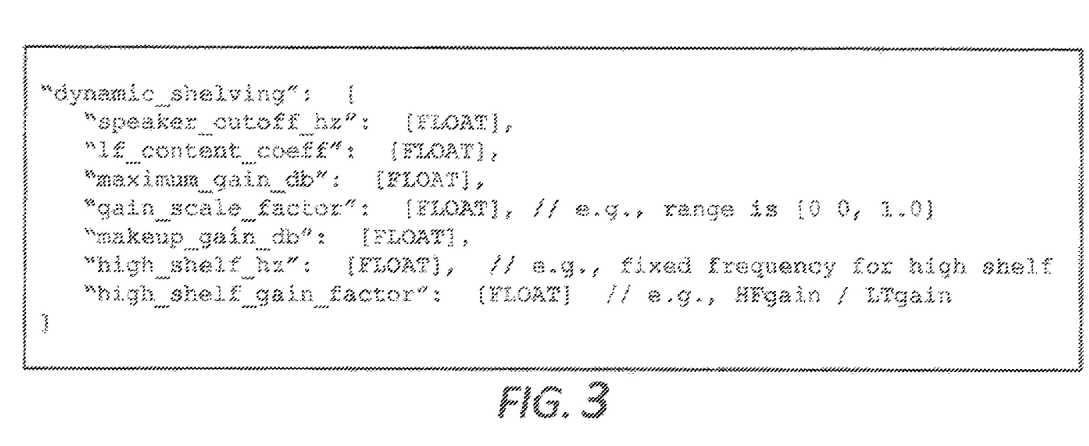
FIG. 3 depicts an example data format for parameters according to example embodiments of the present disclosure.

FIG. 3 depicts an example data format for parameters according to example embodiments of the present disclosure. Referring to FIG. 3, "speaker_cutoff_hz" can correspond to the box-tuning frequency of system 100 before the Linkwitz transform is applied to the at least a portion of the signal, "lf_content_coeff" can correspond to the constant by which the low frequency cutoff is multiplied to determine the frequency for the bandwidth of the low-frequency content, "maximum gain_db" can correspond to the fixed limit utilized in determining the gain for the Linkwitz transform, "gain scale factor" can correspond to the product of the gain for the Linkwitz transform and the constant by which the low-frequency cutoff is multiplied to determine the frequency for the bandwidth of the low-frequency content, "makeup_gain_db" can correspond to the make-up gain of system 100 utilized in determining the gain for the Linkwitz transform, "high_shelf_hz" can correspond to a cutoff frequency for the high-frequency gain equalizer, and "high_shelf_gain_factor" can correspond to the constant by which the gain factor for the Linkwitz transform is multiplied to determine the high-frequency gain.

Figure 4:
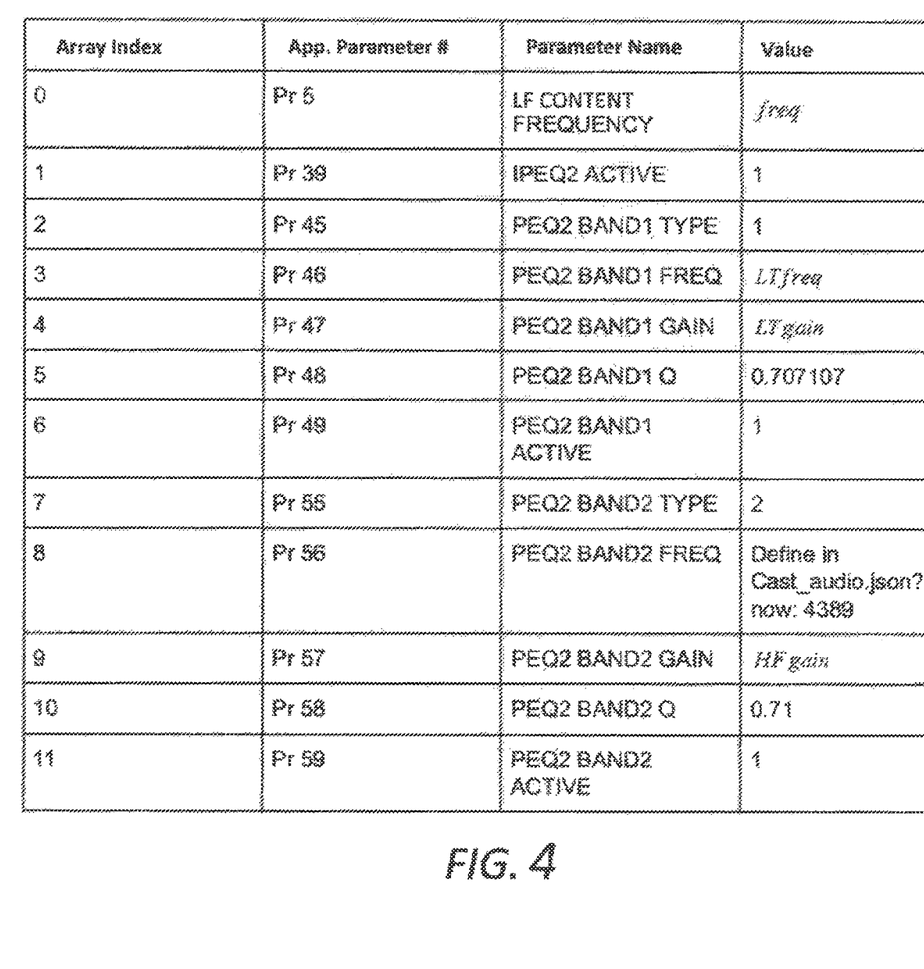
FIG. 4 depicts an example array of parameters according to example embodiments of the present disclosure.

FIG. 4 depicts an example array of parameters according to example embodiments of the present disclosure. Referring to FIG. 4, an array similar to that illustrated can be utilized to pass the parameter(s) described above to a digital signal processor configured to implement the technique(s) described above.

Figure 5:
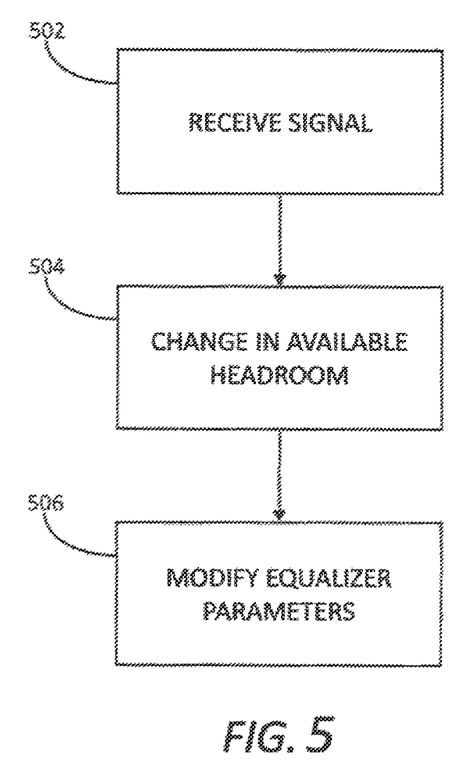
FIGS. 5 and 6 depict flow chart diagrams of example methods according to example embodiments of the present disclosure.
Figure 6:
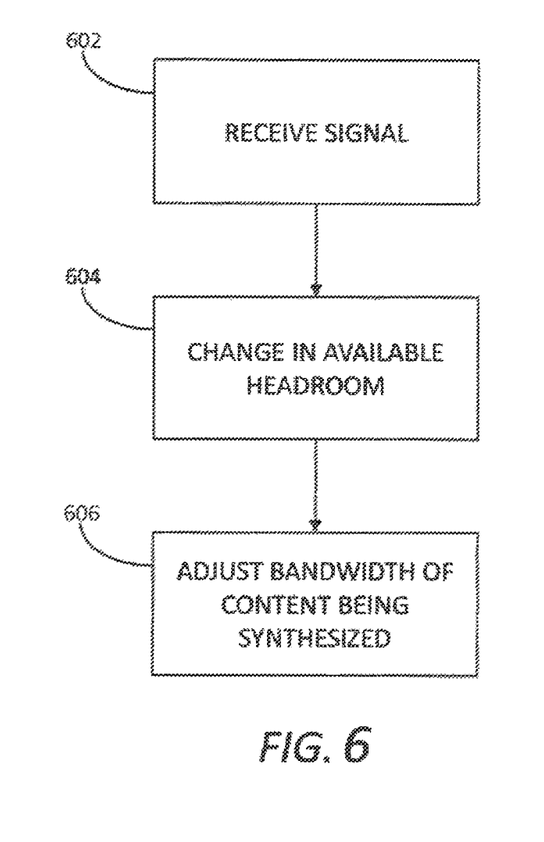

FIGS. 5 and 6 depict flow chart diagrams of example methods according to example embodiments of the present disclosure. Referring to FIG. 5, at (502), a system comprising a loudspeaker can receive an electronic audio signal. For example, system 100 can receive a signal from source 102. At (504), there can be a change in available headroom. For example, there can be a change in available headroom (e.g., based on available headroom of amp 112, a change in volume of system 100, excursion characteristics of a transducer of loudspeaker 114, analysis of the signal received from source 102, and/or the like). At (506), responsive to the change in available headroom, one or more parameters of an equalizer being applied to at least a portion of the signal in order to extend a physical low-frequency response of the loudspeaker can be modified based on the change in available headroom. For example, in some embodiments, the equalizer can be configured to apply a Linkwitz transform to the at least a portion of the signal, and the parameter(s) can comprise a gain for the Linkwitz transform and/or a frequency for the Linkwitz transform.

Referring to FIG. 6, at (602), a system comprising a loudspeaker can receive an electronic audio signal. For example, system 100 can receive a signal from source 102. At (604), there can be a change in available headroom. For example, there can be a change in available headroom (e.g., based on available headroom of amp 112, a change in volume of system 100, excursion characteristics of a transducer of loudspeaker 114, analysis of the signal received from source 102, and/or the like). At (606), responsive to the change in available headroom, a bandwidth of low-frequency content of the signal that is being synthesized by the system to extend low-frequency capability of the system beyond the physical capabilities of the system can be adjusted based on the change in available headroom. For example, in some embodiments, system 100 can be configured to produce (e.g., via loudspeaker 114) a harmonic structure corresponding to a portion of the content of the signal comprising a fundamental frequency that is beyond the physical capabilities of system 100 such that a human brain synthesizes the fundamental frequency as if the fundamental frequency physically existed. In such embodiments, system 100 can be configured to adjust the bandwidth of the low-frequency content based on the change in available headroom (e.g., based on the low-frequency cutoff, which can be based on the gain for the Linkwitz transform, which can be based on a change in volume of system 100).

The technology discussed herein makes reference to servers, databases, software applications, and/or other computer-based systems, as well as actions taken and information sent to and/or from such systems. The inherent flexibility of computer-based systems allows for a great variety of possible configurations, combinations, and/or divisions of tasks and/or functionality between and/or among components. For instance, processes discussed herein can be implemented using a single device or component and/or multiple devices or components working in combination. Databases and/or applications can be implemented on a single system and/or distributed across multiple systems. Distributed components can operate sequentially and/or in parallel.

Various connections between elements are discussed in the above description. These connections are general and, unless specified otherwise, can be direct and/or indirect, wired and/or wireless. In this respect, the specification is not intended to be limiting.

The depicted and/or described steps are merely illustrative and can be omitted, combined, and/or performed in an order other than that depicted and/or described; the numbering of depicted steps is merely for ease of reference and does not imply any particular ordering is necessary or preferred.

The functions and/or steps described herein can be embodied in computer-usable data and/or computer-executable instructions, executed by one or more computers and/or other devices to perform one or more functions described herein. Generally, such data and/or instructions include routines, programs, objects, components, data structures, or the like that perform particular tasks and/or implement particular data types when executed by one or more processors in a computer and/or other data-processing device. The computer-executable instructions can be stored on a computer-readable medium such as a hard disk, optical disk, removable storage media, solid-state memory, read-only memory (RAM), or the like. As will be appreciated, the functionality of such instructions can be combined and/or distributed as desired. In addition, the functionality can be embodied in whole or in part in firmware and/or hardware equivalents, such as integrated circuits, application-specific integrated circuits (ASICs), field-programmable gate arrays (FPGAs), or the like. Particular data structures can be used to more effectively implement one or more aspects of the disclosure, and such data structures are contemplated to be within the scope of computer-executable instructions and/or computer-usable data described herein.

Although not required, one of ordinary skill in the art will appreciate that various aspects described herein can be embodied as a method, system, apparatus, and/or one or more computer-readable media storing computer-executable instructions. Accordingly, aspects can take the form of an entirely hardware embodiment, an entirely software embodiment, an entirely firmware embodiment, and/or an embodiment combining software, hardware, and/or firmware aspects in any combination.

As described herein, the various methods and acts can be operative across one or more computing devices and/or networks. The functionality can be distributed in any manner or can be located in a single computing device (e.g., server, client computer, user device, or the like).

Aspects of the disclosure have been described in terms of illustrative embodiments thereof. Numerous other embodiments, modifications, and/or variations within the scope and spirit of the appended claims can occur to persons of ordinary skill in the art from a review of this disclosure. For example, one or ordinary skill in the art can appreciate that the steps depicted and/or described can be performed in other than the recited order and/or that one or more illustrated steps can be optional and/or combined. Any and all features in the following claims can be combined and/or rearranged in any way possible.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and/or equivalents to such embodiments. Accordingly, the subject disclosure does not preclude inclusion of such modifications, variations, and/or additions to the present subject matter as would be readily apparent to one of ordinary skill in the art. For instance, features illustrated and/or described as part of one embodiment can be used with another embodiment to yield a still further embodiment. Thus, it is intended that the present disclosure cover such alterations, variations, and/or equivalents.

What is claimed is:

1. A method for dynamic equalization performed at a system, the method comprising:
    receiving an electronic audio signal;
    monitoring available headroom based on two or more of: an amplifier of the system, a change in volume of the system, characteristics of a transducer of a loudspeaker associated with the system, and the audio signal; and
    responsive to a change in the available headroom, modifying, based on the change in the available headroom, one or more parameters of an equalizer to at least a portion of the signal in order to extend a physical low-frequency response of the loudspeaker, the one or more parameters comprising a gain.

2. The method of claim 1, further comprising: determining the gain based on a volume of the system and a make-up gain of the system.

3. The method of claim 2, wherein determining the gain based on the volume of the system and the make-up gain of the system further comprises:
    determining a difference between the negative of the volume of the system and the make-up gain.

4. The method of claim 3, wherein the gain is the minimum of the difference and a fixed limit.

5. The method of claim 4, further comprising: determining a low-frequency cutoff based on the gain and a box-tuning frequency of the system.

6. The method of claim 5, wherein determining the low-frequency cutoff comprises: dividing the box-tuning frequency of the system to the at least a portion of the signal by the result of two to the power of the result of dividing the gain by a constant.

7. The method of claim 5, wherein the frequency is the average of the low-frequency cutoff and the box-tuning frequency of the system.

8. A system comprising: circuitry;
    one or more processors; and
    memory storing one or more instructions for execution by the one or more processors, the one or more instructions causing the system to perform operations comprising: receiving an electronic audio signal;
    monitoring available headroom based on two or more of: an amplifier of the system, a change in volume of the system, characteristics of a transducer of a loudspeaker associated with the system, and the audio signal; and
    responsive to a change in the available headroom, modifying, based on the change in the available headroom, one or more parameters of an equalizer to at least a portion of the signal in order to extend a physical low-frequency response of the loudspeaker, the one or more parameters comprising a gain.

9. The system of claim 8, wherein the equalizer comprises a second-order low-frequency shelving equalizer.

10. The system of claim 8, the one or more instructions causing the system to perform operations comprising:
    responsive to the change in the available headroom, adjusting, based on at least one parameter of the one or more parameters, a bandwidth of low-frequency content of the signal that is being synthesized by the system to extend low-frequency capability of the system beyond physical capabilities of the system.

11. The system of claim 10, wherein the at least one parameter comprises the gain.

12. The system of claim 10, wherein the circuitry is configured to cause the system to produce, via the loudspeaker, a harmonic structure corresponding to a portion of the content of the signal comprising a fundamental frequency that is beyond the physical capabilities of the system such that a human brain synthesizes the fundamental frequency as if the fundamental frequency physically existed.

13. The system of claim 10, wherein the instructions for adjusting the bandwidth of low-frequency content comprises instructions for adjusting the bandwidth based on the gain.

14. A non-transitory computer-readable storage medium storing one or more programs for execution by one or more processors of a system, the one or more programs comprising instructions for:
    receiving an electronic audio signal;
    monitoring available headroom based on two or more of: an amplifier of the system, a change in volume of the system, characteristics of a transducer of a loudspeaker associated with the system, and the audio signal; and
    responsive to a change in the available headroom, modifying, based on the change in the available headroom, one or more parameters of an equalizer to at least a portion of the signal in order to extend a physical low-frequency response of the loudspeaker, the one or more parameters comprising a gain.

15. The non-transitory computer-readable storage medium of claim 14, the one or more programs comprising instructions for: determining the gain based on a volume of the system and a make-up gain of the system.

16. The non-transitory computer-readable storage medium of claim 15, wherein the instructions for determining the gain based on the volume of the system and the make-up gain of the system further comprises instructions for:
    determining a difference between the negative of the volume of the system and the make-up gain.

17. The non-transitory computer-readable storage medium of claim 16, wherein the gain is the minimum of the difference and a fixed limit.

18. The non-transitory computer-readable storage medium of claim 17, further comprising instructions for: determining a low-frequency cutoff based on the gain and a boxtuning frequency of the system.

19. The non-transitory computer-readable storage medium of claim 18, wherein the instructions for determining the low-frequency cutoff comprises instructions for:
    dividing the box-tuning frequency of the system to the at least a portion of the signal by the result of two to the power of the result of dividing the gain by a constant.

20. The non-transitory computer-readable storage medium of claim 18, wherein the frequency is the average of the low-frequency cutoff and the box-tuning frequency of the system.

\* \* \* \* \*

UNITED STATES PATENT AND TRADEMARK OFFICE
CERTIFICATE OF CORRECTION

Page 1 of 1

PATENT NO. : 10,666,217 B2
APPLICATION NO. : 16/264121
DATED : May 26, 2020
INVENTOR(S) : Slotnick It is certified that error appears in the above-identified patent and that said Letters Patent is hereby corrected as shown below:

On the Title Page

(57) ABSTRACT, Line 11, please delete "a gain for the and a frequency." and insert --a gain.--.

Signed and Sealed this
Fourth Day of August, 2020

Andrei Iancu
*Director of the United States Patent and Trademark Office*